US011643752B2

United States Patent
Miyano et al.

(10) Patent No.: US 11,643,752 B2
(45) Date of Patent: May 9, 2023

(54) SCALMGO4 MONOCRYSTALLINE SUBSTRATE, AND METHOD OF MANUFACTURE THEREOF

(71) Applicant: Panasonic Intellectual Property Management Co., Ltd., Osaka (JP)

(72) Inventors: Kentaro Miyano, Osaka (JP); Naoya Ryoki, Osaka (JP); Akihiko Ishibashi, Osaka (JP); Masaki Nobuoka, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 562 days.

(21) Appl. No.: 16/739,105

(22) Filed: Jan. 9, 2020

(65) Prior Publication Data

US 2020/0263319 A1 Aug. 20, 2020

(30) Foreign Application Priority Data

Feb. 14, 2019 (JP) .............................. JP2019-024639

(51) Int. Cl.
*C30B 29/22* (2006.01)
*C30B 15/20* (2006.01)

(52) U.S. Cl.
CPC .............. *C30B 29/22* (2013.01); *C30B 15/20* (2013.01)

(58) Field of Classification Search
CPC ................................. C30B 29/22; C30B 15/00
See application file for complete search history.

(56) References Cited

U.S. PATENT DOCUMENTS

| 6,413,627 | B1 | 7/2002 | Motoki et al. |
| 2010/0301495 | A1 | 12/2010 | Chikaki |
| 2011/0001136 | A1 | 1/2011 | Hasegawa et al. |
| 2011/0259261 | A1 | 10/2011 | Iwai et al. |
| 2012/0137961 | A1 | 6/2012 | Iwai et al. |
| 2014/0197420 | A1 | 7/2014 | Iwai et al. |

FOREIGN PATENT DOCUMENTS

| JP | 2004-010460 | 1/2004 |
| JP | 2009-123957 | 6/2009 |
| JP | 2009-161433 | 7/2009 |
| JP | 2010-278121 | 12/2010 |
| JP | 2015-048296 | 3/2015 |
| JP | 2015-178448 | 10/2015 |

(Continued)

OTHER PUBLICATIONS

European Patent Office, English computer translation of JP2018150198 (Year: 2022).*

(Continued)

*Primary Examiner* — Matthew J Song
(74) *Attorney, Agent, or Firm* — Wenderoth, Lind & Ponack, L.L.P.

(57) ABSTRACT

A $ScAlMgO_4$ monocrystalline substrate that is highly cleavable and that does not easily cause cracking in the GaN film id grown on the substrate and a method for manufacturing such a $ScAlMgO_4$ monocrystalline substrate are provided. The $ScAlMgO_4$ monocrystalline substrate has a crystal oxygen concentration of 57 atom % or less as measured by inductively coupled plasma atomic emission spectroscopy analysis.

2 Claims, 2 Drawing Sheets

(56) References Cited

FOREIGN PATENT DOCUMENTS

| JP | 2017119597 A | * | 7/2017 | ............. C30B 29/22 |
| JP | 2017-178764 | | 10/2017 | |
| JP | 2018150198 A | * | 9/2018 | ............. C30B 29/22 |
| JP | 2018-177587 | | 11/2018 | |
| WO | 2010/079655 | | 7/2010 | |
| WO | 2010/143748 | | 12/2010 | |
| WO | 2013/022122 | | 2/2013 | |

OTHER PUBLICATIONS

European Patent Office, English computer translation of 2017119597 (Year: 2022).*

* cited by examiner

SCALMGO4 MONOCRYSTALLINE SUBSTRATE, AND METHOD OF MANUFACTURE THEREOF

TECHNICAL FIELD

The present disclosure relates to a $ScAlMgO_4$ monocrystalline substrate, and a method of manufacture thereof.

BACKGROUND $ScAlMgO_4$ has attracted interest as a substrate for forming gallium nitride (GaN). $ScAlMgO_4$ has a lattice mismatch with GaN that is 1/10 of that of sapphire, a traditional substrate, and has the potential to increase the brightness of light emitting diodes (LEDs).

The Czochralski method (CZ method) is a known method of manufacturing a $ScAlMgO_4$ single crystal. In the CZ method, material is charged into a crucible installed in a chamber, and, after melting the material, a seed crystal is brought into contact with the melt. The seed crystal is then pulled up with a pulling mechanism while being rotated at low speed to grow a single crystal having the same orientation as the seed crystal, and obtain a cylindrical ingot.

JP-A-2015-48296 and JP-A-2015-178448 describe methods for manufacturing $ScAlMgO_4$.

SUMMARY

A problem with growing a GaN film on a $ScAlMgO_4$ monocrystalline substrate, however, is that cracking occurs in the GaN film under the stress exerted by the GaN film and the $ScAlMgO_4$ monocrystalline substrate against each other as a result of warping.

The present disclosure is intended to provide a solution to the foregoing problem, and it is an object of the present disclosure to provide a $ScAlMgO_4$ monocrystalline substrate that does not easily cause cracking in a grown GaN film, and a method for manufacturing such a $ScAlMgO_4$ monocrystalline substrate.

A $ScAlMgO_4$ monocrystalline substrate of an aspect of the present disclosure has a crystal oxygen concentration of 57 atom % or less as measured by inductively coupled plasma atomic emission spectroscopy analysis.

A $ScAlMgO_4$ monocrystalline substrate manufacturing method according to an aspect of the present disclosure includes:

a seeding step of contacting a seed crystal to a melt of a feedstock of a monocrystalline substrate represented by $ScAlMgO_4$ to generate a crystal; and a crystal growth step of growing a single crystal by pulling the crystal generated in the seeding step, wherein, in the crystal growth step, the crystal is pulled from the melt in an atmosphere having an oxygen concentration of 0.1 volume % or less.

With the present disclosure, a $ScAlMgO_4$ monocrystalline substrate can be provided that has high cleavability, and that does not easily cause cracking in the GaN film grown on the substrate. The present disclosure can also provide a method for manufacturing such a $ScAlMgO_4$ monocrystalline substrate.

DESCRIPTION OF EMBODIMENTS

An embodiment of the present disclosure is described below with reference to the accompanying drawings.

Embodiment

Figure 1:
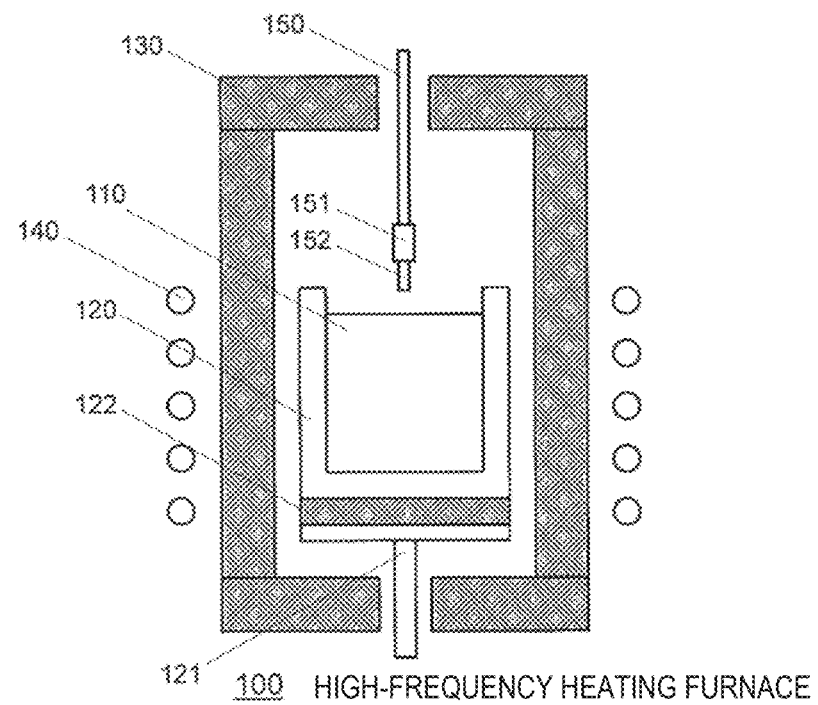
FIG. 1 is a schematic view representing a configuration of a high-frequency heating furnace used in a $ScAlMgO_4$ monocrystalline substrate manufacturing method according to an embodiment of the present disclosure.

FIG. 1 is a schematic view representing a configuration of a high-frequency heating furnace used in a $ScAlMgO_4$ monocrystalline substrate manufacturing method according to an embodiment of the present disclosure. The following descriptions focus primarily on manufacture of a $ScAlMgO_4$ monocrystalline substrate by high-frequency heating. It is possible, however, to employ resistance heating, instead of high-frequency heating. With the method of the present embodiment, a $ScAlMgO_4$ monocrystalline substrate can be obtained that has a low crystal oxygen concentration (specifically, a crystal oxygen concentration of 57 atm % or less as measured by inductively coupled plasma atomic emission spectroscopy analysis). Such a $ScAlMgO_4$ monocrystalline substrate is highly cleavable. This makes it possible to prevent a GaN film from cracking when forming the GaN film on the $ScAlMgO_4$ monocrystalline substrate.

The high-frequency heating furnace 100 shown in FIG. 1 is a crystal pulling device using the CZ method. The high-frequency heating furnace 100 includes a feedstock 110 of $ScAlMgO_4$ monocrystalline substrate, a crucible 120, a crucible supporting rod 121, a refractory 122, a heat insulating material 130, a heating coil 140, a crystal pulling rod 150, a seed holder 151, and a seed crystal 152. Typically, the high-frequency heating furnace 100 also includes other components required for pulling a crystal by the CZ method, for example, such as a chamber, a vacuum pump, a gas inlet, a gas outlet, a power supply, and a controller such as a temperature controller, though not shown in FIG. 1.

In the present embodiment, the feedstock of $ScAlMgO_4$ monocrystalline substrate (hereinafter, also referred to simply as "$ScAlMgO_4$ feedstock") 110 is a once melted admixture of predetermined proportions of scandium oxide ($Sc_2O_3$), aluminum oxide ($Al_2O_3$), and magnesium oxide (MgO).

In the present embodiment, the crucible 120 is an iridium vessel used to hold the $ScAlMgO_4$ feedstock 110. In the present embodiment, the crucible supporting rod 121 is a tungsten rod for supporting the crucible 120. With the crucible supporting rod 121, the crucible 120 can be rotated, and moved up and down, at set speeds.

The refractory 122 is a member disposed between the crucible 120 and the crucible supporting rod 121. In the present embodiment, the refractory 122 is made of zirconia. However, the refractory 122 is not limited to this. The refractory 122 has resistance against reaction with the materials of the crucible 120 and the crucible supporting rod 121.

In the present embodiment, the heat insulating material 130 is made of zirconia. The heat insulating material 130 surrounds the crucible 120. Above the crucible 120, the heat insulating material 130 has a through hole for insertion of the crystal pulling rod 150. Below the crucible 120, the heat insulating material 130 has a through hole for insertion of the crucible supporting rod 121. The heating coil 140 is disposed on the outer side of the heat insulating material 130. Passing a high-frequency current through the heating coil 140 produces a high-frequency magnetic flux. The high-frequency magnetic flux generates eddy-current in the crucible 120. In response, the surface of the crucible 120 generates heat, and heats the $ScAlMgO_4$ feedstock 110 inside the crucible 120.

The crystal pulling rod 150 of the present embodiment is an alumina rod, and functions to rotate, and move up and down, at set speeds. The seed holder 151 is disposed at the tip of the crystal pulling rod 150. In the present embodiment, the seed holder 151 is made of iridium, and the seed crystal 152 can be set at the tip of the seed holder 151. The seed crystal 152 set on the seed holder 151 is $ScAlMgO_4$, and has a square prism shape. However, the shape is not limited to this.

Figure 2:
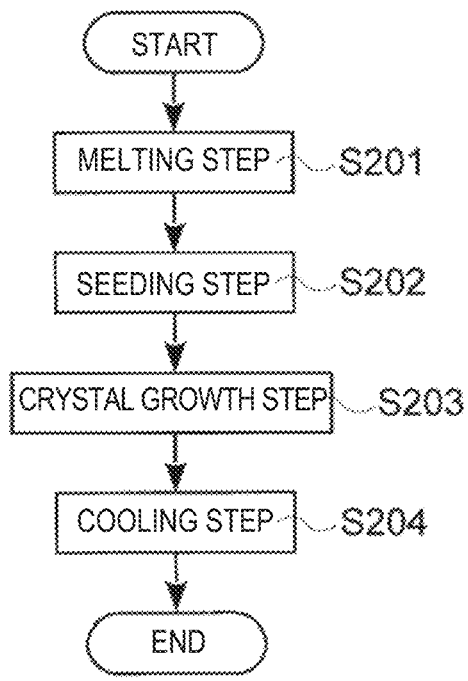
FIG. 2 is a flowchart representing manufacture of a single crystal using a $ScAlMgO_4$ monocrystalline substrate manufacturing method according to an embodiment of the present disclosure.

The following describes manufacture of a $ScAlMgO_4$ single crystal with the high-frequency heating furnace 100, using the flowchart shown in FIG. 2.

First, a melting step (S201) is performed that melts the $ScAlMgO_4$ feedstock 110. In the melting step, the high-frequency heating furnace 100 is vacuumed to create an inert gas atmosphere inside the furnace. An inert gas atmosphere is then introduced until the pressure reaches ordinary pressure. After supplying power, the power applied to the heating coil 140 is gradually increased over a time period long enough to bring the temperature to a temperature that melts the $ScAlMgO_4$ feedstock 110 but short enough not to overload the crucible 120. The heating time depends on the size of the crucible 120, and is preferably 15 hours to 60 hours for a crucible 120 having an outer diameter of 80 mm to 150 mm.

After checking that the $ScAlMgO_4$ feedstock 110 has melted, oxygen is introduced into the furnace. The oxygen concentration can be adjusted by adjusting the proportions of the introduced inert gas and oxygen. For example, when the inert gas is nitrogen and the amount of introduced nitrogen gas is 1 [l/min], the oxygen concentration in the atmosphere inside the furnace becomes 0.1 volume % with the flow rate of mixed oxygen gas set to 1 [ml/min]. Similarly, when the inert gas is nitrogen and the amount of introduced nitrogen gas is 2 [l/min], the oxygen concentration in the atmosphere inside the furnace becomes 0.5 volume % with the flow rate of mixed oxygen gas set to 10 [ml/min]. In the present embodiment, it is preferable that the seeding step (S202) and crystal growth step (S203) (described later) be performed in an atmosphere having an oxygen concentration of 0.1 volume % or less. Particularly preferably, the oxygen concentration is greater than 0 volume %.

The next step is the seeding step (S202). Specifically, the crystal pulling rod 150 being rotated at a certain speed is gradually moved down until the seed crystal 152 touches the molten $ScAlMgO_4$ feedstock 110. After the seed crystal 152 has touched the molten $ScAlMgO_4$ feedstock 110, the melt temperature of the molten $ScAlMgO_4$ feedstock 110 is allowed time to stabilize at a temperature suitable for pulling the crystal.

The next step is the crystal growth step (S203), in which the crystal generated in the seeding step (202) is pulled up to grow a single crystal. The crystal pulling rod 150 is moved up at a certain speed while being rotated at a certain speed. Here, the rotational speed of the crystal pulling rod 150 is preferably 1 rpm to 10 rpm, and the pulling rate of the crystal pulling rod 150 is preferably 0.1 mm/hour to 1.5 mm/hour. After the pulling has started, the crystal is controlled to have the desired shape by automatic diameter control. After being pulled over a distance of the desired length, the crystal is separated from the melt of $ScAlMgO_4$ feedstock 110, and the inflow of oxygen into the furnace is cut off.

This is followed by a cooling step (S204). In this step, the crystal is cooled by gradually decreasing the applied power to the heating coil 140 over a length of time that does not place a large load on the crucible 120 and on the pulled crystal. The cooling time depends on the size of the crucible 120, and is preferably 20 hours to 70 hours for a crucible 120 having an outer diameter of 80 mm to 150 mm.

Figure 3:
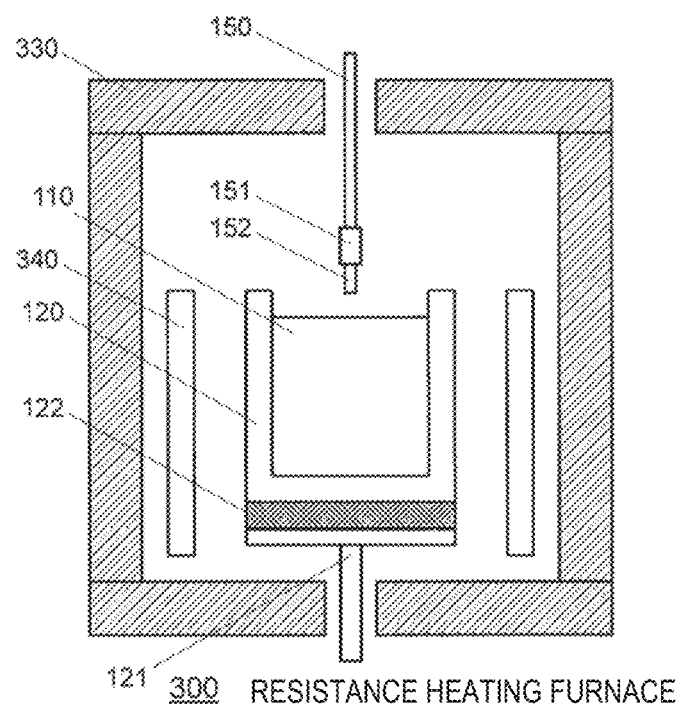
FIG. 3 is a schematic view representing a configuration of a resistance heating furnace used in a $ScAlMgO_4$ monocrystalline substrate manufacturing method according to an embodiment of the present disclosure.

A resistance heating furnace 300 usable in the $ScAlMgO_4$ monocrystalline substrate manufacturing method of the present embodiment differs from the high-frequency heating furnace 100 in that the resistance heating furnace 300 has a heat insulating material 330 and a heater 340, instead of the heat insulating material 130 and the heating coil 140, as shown in FIG. 3. The other features may be the same as those of the high-frequency heating furnace 100.

In the resistance heating furnace 300, the heat insulating material 330 is carbon, and is disposed so as to surround the crucible 120. The heater 340 is a tubular carbon heater. The heater 340 generates heat upon passing current, and heats the $ScAlMgO_4$ feedstock 110 inside the crucible 120.

The manufacturing steps shown in FIG. 2 can be used to produce a $ScAlMgO_4$ single crystal with the resistance heating furnace 300, as with the case of high-frequency heating. First, the melting step (S201) is carried out to melt the $ScAlMgO_4$ feedstock 110. The melting step may use the same procedures described above for the high-frequency heating furnace 100. For example, in the melting step, an inert gas atmosphere is created after vacuuming, and the pressure is brought to ordinary pressure with the inert gas atmosphere. After supplying power, the power applied to the heater 340 is gradually increased over a time period long enough to bring the temperature to a temperature that melts the $ScAlMgO_4$ feedstock 110 but short enough not to overload the crucible 120 so as to be heated. The heating time is the same as the heating time for the high-frequency heating furnace 100, and the oxygen concentration in the furnace in this case is also adjusted by adjusting the proportions of the introduced inert gas and oxygen.

This is followed by the seeding step (S202), the crystal growth step (S203), and the cooling step (S204). These may be the same steps performed with the high-frequency heating furnace 100.

Regardless of whether the $ScAlMgO_4$ monocrystalline substrate is manufactured with the high-frequency heating furnace 100 or the resistance heating furnace 300, a highly cleavable $ScAlMgO_4$ monocrystalline substrate having a crystal oxygen concentration of 57 atm % or less as measured by inductively coupled plasma atomic emission spectroscopy analysis can be obtained with more ease by adjusting the oxygen concentration to 0.1 volume % or less in the atmosphere of the crystal growth step (S203). A $ScAlMgO_4$ monocrystalline substrate having even higher cleavability can be obtained by adjusting the temperature gradient immediately below the liquid level of the melt of the ScAlMgO$_4$ feedstock 110 in the crystal growth step (S203).

Specifically, less oxygen dissolves into the melt, and the oxygen concentration in the pulled crystal decreases when the oxygen concentration in the atmosphere inside the furnace is lowered, and the temperature gradient immediately below the liquid level of the melt of the molten ScAlMgO$_4$ feedstock 110 (a temperature increase per millimeter of depth from the liquid level of the melt) is increased. In order to increase the temperature gradient immediately below the liquid level of the melt, the difference between the highest temperature and the lowest temperature at the side surface of the crucible 120 needs to be increased. Increasing the highest temperature at the side surface of the crucible 120 creates a region of increased melt temperature, and the oxygen becomes removed from the melt, when the melt is an oxide. In this case, the oxygen concentration in the pulled crystal decreases when the oxygen concentration in the atmosphere inside the furnace is low.

However, increasing the highest temperature at the side surface of the crucible 120 produces intense convection in the melt inside the crucible 120. This makes it difficult to stabilize the melt temperature of the molten ScAlMgO$_4$ feedstock 110 in the seeding step (S202). It is accordingly preferable to control the melt temperature at the accuracy of 0.5 [° C.] or less to stabilize the melt temperature at a temperature suited for pulling the crystal.

Figure 4:
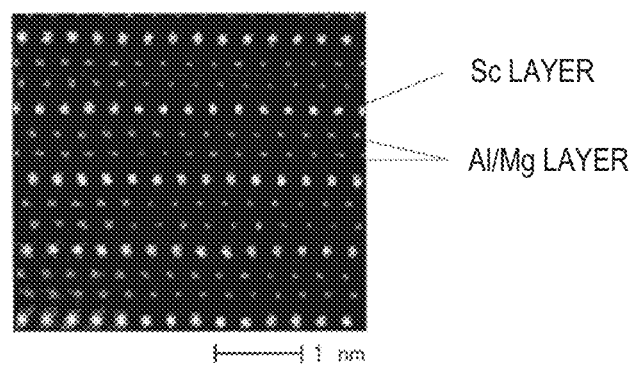
FIG. 4 is a picture, taken by Transmission Electron Microscope, of a crystalline structure of a $ScAlMgO_4$ monocrystalline substrate according to an embodiment of the present disclosure.

FIG. 4 is a picture, taken by Transmission Electron Microscope, of a ScAlMgO$_4$ monocrystalline substrate fabricated using the method described above. The ScAlMgO$_4$ single crystal has an alternately stacked structure of rocksalt-type ScO$_2$ layers (Sc layer in FIG. 4) and hexagonal AlMgO$_2$ layers (Al/Mg layer in FIG. 4). The ScAlMgO$_4$ single crystal cleaves between the AlMgO$_2$ layers of weak bond strength. The number of oxygen atoms bonding to the AlMgO$_2$ layers of weak bond strength decreases, and the cleavability increases as the oxygen concentration in the crystal decreases.

The temperature gradient immediately below the liquid level of the melt of the molten ScAlMgO$_4$ feedstock 110 varies with changes in the aperture area of the through hole provided above the heat insulating material 130 or 330 for insertion of the crystal pulling rod 150, regardless of the high-frequency heating furnace 100 or the resistance heating furnace 300. Increasing the aperture area of the through hole results in smaller temperature gradients. Decreasing the aperture area results in larger temperature gradients. Specifically, a ScAlMgO$_4$ single crystal having an even lower oxygen concentration can be produced when the ScAlMgO$_4$ monocrystalline substrate is manufactured in such a manner as to provide a temperature gradient of 4.4° C./mm or more immediately below the liquid level of the melt, as will be described later in greater detail.

After being pulled, the ScAlMgO$_4$ single crystal is cut into a substrate of a desired thickness, using a method such as cleaving, laser slicing, or wire slicing, thus manufacturing a ScAlMgO$_4$ monocrystalline substrate. The front and back surfaces of the ScAlMgO$_4$ monocrystalline substrate serve as principal surfaces, which are used to grow a GaN film or the like. The principal surfaces may be planarized using techniques such as polishing and grinding.

In the present embodiment, when the ScAlMgO$_4$ monocrystalline substrate is used as a substrate for growing a film (for example, a GaN film), it is preferable to set the curvature radius R [m] and thickness $t_s$ [m] of the ScAlMgO$_4$ monocrystalline substrate so that σ in the following formula satisfies 5.0 or more.

$$\sigma \text{ [N/mm}^2\text{]} \leq (E_f \times t_f^2) \times 10^3 / (6 \times (1-v_f) \times R \times t_s)$$

In the formula, $E_f$ [GPa] represents the Young's modulus of the film (GaN film in this example) to be grown on the ScAlMgO$_4$ monocrystalline substrate by crystal growth, $v_f$ represents the Poisson's ratio of the film to be grown by crystal growth (GaN film in this example), and $t_f$ [m] represents the thickness of the film to be grown by crystal growth (GaN film in this example).

With the curvature radius R [m] and thickness $t_s$ [m] of the ScAlMgO$_4$ monocrystalline substrate adjusted to satisfy the foregoing formula, the stress (warping stress) that generates upon growing a film (a GaN film in this example) on the ScAlMgO$_4$ monocrystalline substrate exceeds the cleavage strength of the ScAlMgO$_4$ monocrystalline substrate, as will be described in greater detail in EXAMPLES below. That is, the ScAlMgO$_4$ monocrystalline substrate cleaves, and detaches itself from the film grown by crystal growth (GaN film), before cracking occurs in the grown film (GaN film) under the warping stress.

Preferably, the ScAlMgO$_4$ monocrystalline substrate has a full width at half maximum [s] of preferably 20 [s] or less as measured from a rocking curve obtained by X-ray diffraction analysis of a cut wafer.

When forming a GaN film on the ScAlMgO$_4$ monocrystalline substrate, the GaN film is formed by using a vapor-phase deposition method, for example, such as hydride vapor-phase epitaxy (HVPE), or metal organic chemical vapor deposition (MOCVD). It is also possible to form the GaN film using a liquid-phase deposition method, for example, a flux method using a melt of alkali metals (flux), such as the sodium flux method.

The heat insulating material 130 was described as being made of zirconia. However, this is not limited to zirconia. The crucible 120 and the seed holder 151 were described as being made of iridium. However, these are not limited to iridium. The crucible supporting rod 121 was described as being made of tungsten. However, the material of the crucible supporting rod 121 is not particularly limited, as long as it does not react with the refractory 122. The refractory 122 was described as being made of zirconia. However, the material of the refractory 122 is not particularly limited, as long as it does not react with the crucible 120 and the crucible supporting rod 121. The crystal pulling rod 150 was described as being made of alumina. However, the material of the crystal pulling rod 150 is not particularly limited, as long as it does not react with the seed holder 151.

EXAMPLES

Examples 1 and 2, and Comparative Example 1

Table 1 shows the results of growing a GaN film on the ScAlMgO$_4$ monocrystalline substrate following the crystal growth conducted with the high-frequency heating furnace 100 shown in FIG. 1. In Comparative Example 1 and Examples 1 and 2, the oxygen concentration in the atmosphere inside the furnace (crystal growth step), and the temperature gradient immediately below the liquid level of the melt were varied as shown in Table 1. Table 1 also shows the oxygen concentration in the ScAlMgO$_4$ monocrystalline substrate obtained, the cleavage strength of the pulled crystal, the presence or absence of detachment of the ScAlMgO$_4$ monocrystalline substrate when the GaN film was formed on the ScAlMgO$_4$ monocrystalline substrate, and the presence or absence of cracking in the GaN film.

The oxygen concentration in the atmosphere inside the high-frequency heating furnace 100 (particularly, in the crystal growth step) was adjusted by adjusting the flow rate of inert gas (nitrogen) and the flow rate of oxygen into the furnace. In Examples 1 and 2, the flow rate of mixed oxygen was adjusted to 1 [ml/min] relative to the flow rate of inert gas (nitrogen) at 1 [l/min]. In Comparative Example 1, the flow rate of mixed oxygen was adjusted to 5 [ml/min] relative to the flow rate of inert gas (nitrogen) at 1 [l/min]. With an oxygen level of 0, the crystal surface turned white, and cracks occurred, though not shown in Table 1. This is the result of the excessively low oxygen concentration in the crystal.

The temperature gradient immediately below the liquid level of the melt was adjusted by adjusting the aperture area of the through hole provided for insertion of the crystal pulling rod 150. Specifically, the aperture area of the through hole was adjusted to 0.41 in Example 1, relative to the aperture area of 1.00 in Comparative Example 1. This produced a temperature gradient of 4.7° C./mm immediately below the liquid level of the melt. The aperture area was set to 0.56 in Example 2. This produced a temperature gradient of 4.4° C./mm immediately below the liquid level of the melt.

Measurement and Evaluation of Properties

The following methods were used for the measurement and evaluation of various numerical values.

Crystal Oxygen Concentration

Crystal oxygen concentration was measured by inductively coupled plasma atomic emission spectroscopy. Specifically, the main components Sc, Al, and Mg of the ScAlMgO$_4$ single crystal were analyzed, and the concentration of all the remaining components was calculated as the oxygen concentration after subtracting the analyzed values for Sc, Al, and Mg, using an inductively coupled plasma atomic emission spectroscopy device iCAP 7400 Duo (manufactured by Thermo Fisher Scientific Inc.).

Temperature Gradient Immediately Below Liquid Level of Melt

For the measurement of temperature gradient immediately below the liquid level of the melt, a tungsten (W)-rhenium (Re) thermocouple (W·5% Re-W·26% Re) was inserted into an iridium protective tube, and the iridium protective tube was lowered down, in place of the crystal pulling rod 150, through the through hole provided through the heat insulating material 130, shown in FIG. 1, for insertion of crystal pulling rod 150, until the tube touched the melt of ScAlMgO$_4$ feedstock 110 inside the crucible 120.

Cleavage Strength

For the measurement of cleavage strength, an aluminum rivet was bonded to the ScAlMgO$_4$ monocrystalline substrate, and the force needed to cleave and detach the ScAlMgO$_4$ monocrystalline substrate was measured by pulling the aluminum rivet bonded to the substrate, using a small tabletop tester EX-S500N (Shimadzu Corporation).

Detachment of Substrate, and Cracking of Grown Film

Detachment of the substrate, and cracking of the grown film were confirmed by visual inspection.

TABLE 1

|  | Ex. 1 | Ex. 2 | Com. Ex. 1 |
| --- | --- | --- | --- |
| Oxygen concentration in atmosphere [volume %] | 0.1 | 0.1 | 0.5 |
| Temperature gradient immediately below liquid level of melt [° C./mm] | 4.7 | 4.4 | 2.6 |
| Cleavage strength [N/mm$^2$] | 4.9 | 5.0 | 8.2 |
| Crystal oxygen concentration [atom %] | 56 | 57 | 58 |
| Detachment of substrate | Present | Present | Absent |
| Cracking of grown film | Absent | Absent | Present |

As can be understood from Table 1 that the oxygen concentration in the crystal, and the cleavage strength decrease when the oxygen concentration in the atmosphere is 0.1 volume % or less in the crystal growth step, and when the temperature gradient immediately below the liquid level of the melt is 4.4° C./mm or more. The cleavage strength was 5.0 N/mm$^2$ or less with a crystal oxygen concentration of 57 atm % or less. In this case, the ScAlMgO$_4$ monocrystalline substrate detached itself from the GaN film before cracking occurred in the GaN film, and there was no cracking in the GaN film grown on the substrate, even when the substrate was placed under stress in growing GaN on the ScAlMgO$_4$ monocrystalline substrate by crystal growth.

Applied Stress on ScAlMgO$_4$ Monocrystalline Substrate

The following describes the stress applied to the ScAlMgO$_4$ monocrystalline substrate when growing GaN on a principal surface of the ScAlMgO$_4$ monocrystalline substrate by crystal growth. The stress σ [N/mm$^2$] applied to the ScAlMgO$_4$ monocrystalline substrate from the film grown on the ScAlMgO$_4$ monocrystalline substrate is represented by Stoney's equation (formula 1). In the formula, $E_f$ [GPa] is the Young's modulus of the grown film, $v_f$ is the Poisson's ratio of the grown film, $t_f$ [m] is the thickness of the grown film, $t_s$ [m] is the thickness of the ScAlMgO$_4$ monocrystalline substrate, and R [m] is the curvature radius of the grown film.

$$\sigma = (E_f \times t_f^2) \times 10^3 / (6 \times (1 - v_f) \times R \times t_s) \quad \text{(formula 1)}$$

When the grown film is a GaN film, the Young's modulus $E_f$ is 321 GPa, and the Poisson's ratio $v_f$ is 0.21. For example, Table 2 shows the range of curvature radius R [m] in which the applied stress on the ScAlMgO$_4$ monocrystalline substrate takes a value of 5.0 N/mm$^2$ or more at different thicknesses of the ScAlMgO$_4$ monocrystalline substrate with the thickness of the GaN film at 1 mm. Essentially, R in formula 1 represents the curvature radius of the grown film. However, because the film is grown on the ScAlMgO$_4$ monocrystalline substrate, the grown film and the substrate have the same curvature radius. For reliability, it is preferable to set the curvature radius R [m] and thickness $t_s$ [m] of the ScAlMgO$_4$ monocrystalline substrate so that σ is less than 8.2 [N/mm$^2$].

TABLE 2

| Thickness of GaN film [mm] | Thickness of ScAlMgO₄ monocrystalline substrate [μm] | Range of curvature radius [m] |
|---|---|---|
| 1 | 400 | 33 or less |
| 1 | 300 | 44 or less |
| 1.5 | 400 | 75 or less |
| 1.5 | 300 | 100 or less |

The grown GaN film having a thickness of 1 mm or 1.5 mm in this example may have a desired thickness. In such a case, the ScAlMgO₄ monocrystalline substrate is manufactured by choosing a curvature radius R and a thickness $t_s$ of the ScAlMgO₄ monocrystalline substrate that satisfy $5.0 \leq \sigma$ for the desired thickness $t_f$ of the GaN film while controlling the oxygen concentration of the ScAlMgO₄ monocrystalline substrate within a range of 57 atom % or less. When a GaN film of desired thickness $t_f$ is fabricated using such a ScAlMgO₄ monocrystalline substrate, the applied stress on the ScAlMgO₄ monocrystalline substrate due to warping exceeds the cleavage strength of the ScAlMgO₄ monocrystalline substrate. This results in the ScAlMgO₄ monocrystalline substrate detaching itself from the GaN film before cracking occurs in the GaN film, thereby releasing the internal stress.

The curvature radius $R_s$ [m] of the ScAlMgO₄ monocrystalline substrate varies with the rotational speed a [rpm] and pulling rate b [mm/h] of the crystal pulling rod 150. Table 3 shows the curvature radii $R_s$ [m] of ScAlMgO₄ monocrystalline substrates produced under the same conditions shown in Table 1 in Example 1, except for the rotational speed a [rpm] and the pulling rate b [mm/h].

TABLE 3

| Rotational speed a [rpm] | Pulling rate b [mm/h] | curvature radius $R_s$ [m] of ScAlMgO₄ monocrystalline substrate |
|---|---|---|
| 5 | 0.7 | 30.0 |
| 2 | 0.7 | 129.9 |
| 5 | 0.3 | 15.8 |

It can be seen from Table 3 that the curvature radius $R_s$ [m] of the ScAlMgO₄ monocrystalline substrate increases with decrease of the rotational speed a [rpm], and decreases with decrease of the pulling rate b [mm/h].

The ScAlMgO₄ monocrystalline substrate of the present disclosure can have increased cleavability. This makes it possible to reduce cracking in the GaN film grown on the substrate. The film grown on the ScAlMgO₄ monocrystalline substrate is preferably GaN.

However, materials satisfying $5.0 \leq \sigma$ in formula 1 are also usable as grown films.

The ScAlMgO₄ monocrystalline substrate and the method of manufacture thereof according to the present disclosure are useful in deposition of a GaN film and other such applications.

What is claimed is:

1. A stacked structure comprising
   a ScAlMgO₄ monocrystalline substrate, and
   a GaN film on a principal surface of the ScAlMgO₄ monocrystalline substrate,
   wherein the ScAlMgO₄ monocrystalline substrate has a crystal oxygen concentration of 57 atom % or less and 56 atom % or greater as measured by inductively coupled plasma atomic emission spectroscopy analysis,
   wherein the ScAlMgO₄ monocrystalline substrate has a curvature radius R and a thickness $t_s$ satisfying 5.0 N/mm² $\leq \sigma$ in the following formula:

$$\sigma = (E_f \times t_f^2) \times 10^3 / (6 \times (1-v_f) \times R \times t_s),$$

wherein $E_f$ represents the Young's modulus of the GaN film,
   wherein $v_f$ represents the Poisson's ratio of the GaN film, and
   wherein $t_f$ represents the thickness of the GaN film,
   wherein the thickness ($t_s$) of the ScAlMgO₄ monocrystalline substrate is 300 μm to 400 μm, and
   wherein the thickness ($t_s$) of the GaN film is 1 mm to 1.5 mm.

2. The stacked structure according to claim 1,
   wherein the ScAlMgO₄ monocrystalline substrate is manufactured by a method comprising:
   a seeding step of contacting a seed crystal to a melt of a feedstock of a monocrystalline substrate represented by ScAlMgO₄ to generate a crystal; and
   a crystal growth step of growing a single crystal by pulling the crystal generated in the seeding step,
   wherein, in the crystal growth step, the crystal is pulled from the melt in an atmosphere having an oxygen concentration of 0.1 volume % or less, and
   wherein, in the crystal growth step, the melt has a temperature gradient of 4.4° C/mm or more immediately below its liquid level.

* * * * *